United States Patent
Zheng

(10) Patent No.: US 10,495,535 B2
(45) Date of Patent: Dec. 3, 2019

(54) DIFFERENTIAL CAPACITIVE MEMS PRESSURE SENSOR AND MANUFACTURING METHOD THEREOF

(71) Applicant: GOERTEK.INC, Weifang, Shandong (CN)

(72) Inventor: Guoguang Zheng, Weifang (CN)

(73) Assignee: GOERTEK.INC, Weifang, Shandong (CN)

( * ) Notice: Subject to any disclaimer, the term of this patent is extended or adjusted under 35 U.S.C. 154(b) by 108 days.

(21) Appl. No.: 15/559,331

(22) PCT Filed: Dec. 10, 2015

(86) PCT No.: PCT/CN2015/096916
§ 371 (c)(1),
(2) Date: Sep. 18, 2017

(87) PCT Pub. No.: WO2016/192360
PCT Pub. Date: Dec. 8, 2016

(65) Prior Publication Data
US 2018/0113041 A1    Apr. 26, 2018

(30) Foreign Application Priority Data

May 29, 2015    (CN) .......................... 2015 1 0290080

(51) Int. Cl.
*G01L 9/12*    (2006.01)
*B81B 7/02*    (2006.01)
(52) U.S. Cl.
CPC .................. *G01L 9/12* (2013.01); *B81B 7/02* (2013.01); *B81B 2201/0264* (2013.01)
(58) Field of Classification Search
CPC .......................... G01L 9/12; B81B 2201/0264
See application file for complete search history.

(56) References Cited

U.S. PATENT DOCUMENTS 5,056,369 A * 10/1991 Tamai .................. G01L 9/0073
361/283.3
5,679,902 A    10/1997 Ryhanen
(Continued)

FOREIGN PATENT DOCUMENTS

CN    201740612 U    2/2011
CN    103563399 A    2/2014
(Continued)

OTHER PUBLICATIONS

The First Chinese Office Action dated Feb. 27, 2017; Appln. No. 201510290080.3.
(Continued)

*Primary Examiner* — Lisa M Caputo
*Assistant Examiner* — Alex T Devito

(57) ABSTRACT

The present invention discloses a differential capacitive MEMS pressure sensor and a manufacturing method thereof. The MEMS pressure sensor includes a sensitive structural layer, which includes a common sensitive part and a common supporting part located on the edge of the common sensitive part, a thickness of the common supporting part being larger than that of the common sensitive part; and the MEMS pressure sensor also includes an upper fixed electrode structural layer and a lower fixed electrode structural layer which are vertically symmetric relative to the sensitive structural layer and used for forming differential capacitors with the common sensitive part. According to the MEMS pressure sensor of the present invention, by the differential capacitor structures, inhibition of chips on common-mode signals is enhanced, and a signal to noise ratio of output signals is improved. Meanwhile, the thickness of the common supporting part of the present invention is larger than that of the common sensitive part, such that the peripheral common supporting part can shield strains caused by temperatures and stresses. Therefore, the strains trans- (Continued)

mitted to the common sensitive part because of temperature and stress changes are greatly reduced, and temperature stability and stress stability of the chips are improved.

9 Claims, 8 Drawing Sheets

(56) References Cited

U.S. PATENT DOCUMENTS 6,431,003 B1 * 8/2002 Stark ................... G01L 9/0073
73/718
2003/0005774 A1 1/2003 Suzuki et al.

FOREIGN PATENT DOCUMENTS

| CN | 105067178 A | 11/2015 |
| CN | 204964093 U | 1/2016 |
| DE | 102011017462 A1 | 10/2012 |

OTHER PUBLICATIONS

The Second Chinese Office Action dated Aug. 22, 2017; Appln. No. 201510290080.3.
The Chinese Notification to Grant Patent dated Nov. 6, 2017; Appln. No. 201510290080.3.

* cited by examiner

DIFFERENTIAL CAPACITIVE MEMS PRESSURE SENSOR AND MANUFACTURING METHOD THEREOF

CROSS REFERENCE TO RELATED APPLICATION

This application is a national stage application, filed under 35 U.S.C. § 371, of International Application No. PCT/CN2015/096916, filed on Dec. 10, 2015, which claims priorities to Chinese Application No. 201510290080.3 filed on May 29, 2015, the contents of which are hereby incorporated by reference in their entirety.

FIELD OF THE INVENTION

The present invention relates to the field of sensors, and more particularly, relates to a differential capacitive micro electro-mechanical system (MEMS) pressure sensor; and the present invention further relates to a manufacturing method of the differential capacitive MEMS pressure sensor.

BACKGROUND OF THE INVENTION

In existing technical solutions, MEMS pressure sensors mainly include a capacitive type and a resistive type, wherein the capacitive type MEMS pressure sensor comprises a pressure-sensitive film, a substrate and contacts. The pressure-sensitive film and the substrate form a sealed vacuum cavity, and a capacitance plate formed by the pressure-sensitive film will make a reaction to external pressure changes. When external air pressures are changed, the pressure-sensitive film positioned above the vacuum cavity will be bent; therefore, a capacitance value formed by the pressure-sensitive film and the substrate will be changed, and further the change of this capacitance is read by an ASIC circuit to represent the external pressure changes.

The capacitive MEMS pressure sensors mentioned above detect the external pressure changes by single capacitor. Generally speaking, a capacitance change quantity caused by a change of the external air pressures is very small, and an error of detection carried out by adopting the single capacitor is very large. Besides, except for the external pressure changes, other interference signals will also cause the capacitance change. For example, stress, temperature and other common-mode signals all will affect a change value of the capacitance. These harmful signals will not be attenuated or filtered but will be output together with pressure signals. Thus, the precision and stability of pressure detection are further influenced.

Therefore, there is a demand in the art that a new solution to address at least one of the problems in the prior art.

SUMMARY OF THE INVENTION

One object of this invention is to provide a new technical solution for a differential capacitive MEMS pressure sensor.

According to a first aspect of the present invention, there is provided a differential capacitive MEMS pressure sensor, comprising:

a sensitive structural layer, comprising a common sensitive part located in the middle and a common supporting part located on the edge of the common sensitive part, wherein the common sensitive part is connected on the side wall of the common supporting part, and a thickness of the common supporting part is larger than that of the common sensitive part, such that a whole section of the sensitive structural layer is dumbbell-shaped;

an upper fixed electrode structural layer, comprising an upper fixed electrode which is suspended above the common sensitive part and forms a capacitor structure with the common sensitive part, the upper fixed electrode being provided with corrosion holes;

a lower fixed electrode structural layer, consistent with the upper fixed electrode structural layer in structure, wherein the two are vertically symmetric along the sensitive structural layer, wherein the lower fixed electrode structural layer comprises a lower fixed electrode, which is suspended below the common sensitive part and forms a capacitor structure with the common sensitive part, and the lower fixed electrode is provided with corrosion holes; and a substrate for supporting, a vacuum cavity being formed between the substrate and the common sensitive part.

Alternatively or optionally, a connection position between the common supporting part and the common sensitive part has a transitional common slope, and the common slope comprises a first slope located on an upper surface of the common supporting part, and a second slope located on a lower surface of the common supporting part.

Alternatively or optionally, the upper fixed electrode structural layer comprises an upper fixed electrode supporting part connecting to the edge of the upper fixed electrode, the upper fixed electrode supporting part is connected to the upper surface of the common supporting part by an insulating layer; and the lower fixed electrode structural layer comprises a lower fixed electrode supporting part connecting to the edge of the lower fixed electrode, the lower fixed electrode supporting part is connected to the upper surface of the common supporting part by an insulating layer.

Alternatively or optionally, the upper fixed electrode structural layer further comprises an inclined upper fixed electrode connecting part, wherein the upper fixed electrode is connected to the upper fixed electrode supporting part by the upper fixed electrode connecting part, and the upper fixed electrode connecting part is located above the first slope and has the same slant as the first slope; and the lower fixed electrode structural layer further comprises an inclined lower fixed electrode connecting part, wherein the lower fixed electrode is connected to the lower fixed electrode supporting part by the lower fixed electrode connecting part, and the lower fixed electrode connecting part is located below the second slope and has the same slant as the second slope.

Alternatively or optionally, an insulating layer is respectively disposed between the upper fixed electrode connecting part and the first slope and between the lower fixed electrode connecting part and the second slope.

Alternatively or optionally, the lower fixed electrode supporting part is provided with a conductive part, the conductive part penetrates through the insulating layer and the common supporting part to be connected with the upper fixed electrode supporting part, and is isolated on the upper fixed electrode supporting part to form a first conductive contact of the lower fixed electrode;

the common supporting part is provided with a conductive part, the conductive part penetrates through the insulating layer to be connected with the upper fixed electrode supporting part, and is isolated on the upper fixed electrode supporting part to form a second conductive contact of the common sensitive part; and the upper fixed electrode supporting part is further provided with a third conductive contact of the upper fixed electrode.

Alternatively or optionally, the substrate is connected on the lower fixed electrode supporting part of the lower fixed electrode structural layer by the insulating layer.

Alternatively or optionally, the substrate is connected on the common supporting part of the sensitive structural layer by the insulating layer, and the lower fixed electrode structural layer is suspended in the vacuum cavity.

The present invention further provides a manufacturing method of the MEMS pressure sensor mentioned above, which comprises the following steps:

a) etching a through-hole running through upper and lower ends of the sensitive structural layer in one end of the sensitive structural layer, then growing an insulating layer on a wall of the through-hole and filling a polycrystalline silicon conductive material or metal part into the through hole;

b) etching or corroding the upper surface of the sensitive structural layer to form the lower surface of the common supporting part, the second slope and the lower surface of the common sensitive part;

c) growing the insulating layer on the upper surface of the whole sensitive structural layer and carrying out patterned etching on the insulating layer;

d) depositing the lower fixed electrode structural layer on the upper surface of the insulating layer to form the lower fixed electrode supporting part, the lower fixed electrode connecting part and the lower fixed electrode; the lower fixed electrode supporting part and the polycrystalline silicon conductive material or metal part being connected;

e) etching the lower fixed electrode to form the corrosion holes;

f) corroding the insulating layer between the lower fixed electrode and the common sensitive part by the corrosion holes and releasing the lower fixed electrode from the common sensitive part;

g) turning over the whole sensitive structural layer and the lower fixed electrode structural layer, and bonding the two on the substrate, thereby forming the vacuum cavity between the substrate and the common sensitive part;

h) etching or corroding the upper surface of the sensitive structural layer to form the upper surface of the common supporting part, the first slope and the upper surface of the common sensitive part;

i) growing the insulating layer on the upper surface of the whole sensitive structural layer and carrying out patterned etching on the insulating layer;

j) depositing the upper fixed electrode structural layer on the upper surface of the insulating layer to form the upper fixed electrode supporting part, the upper fixed electrode connecting part and the upper fixed electrode, wherein the upper fixed electrode supporting part, the polycrystalline silicon conductive material or the metal part and the common supporting part are connected by the patterned insulating layer;

k) manufacturing the first conductive contact, the second conductive contact and the third conductive contact in corresponding positions of the upper fixed electrode supporting part;

l) etching the upper fixed electrode to form the corrosion holes; and etching the upper fixed electrode supporting part to isolate the first conductive contact, the second conductive contact and the third conductive contact from one another; and m) etching the insulating layer between the upper fixed electrode and the common sensitive part by the corrosion holes and releasing the upper fixed electrode from the common sensitive part.

Alternatively or optionally, the method further comprises a step of thinning the sensitive structural layer to a predetermined thickness between the step g) and the step h).

According to the MEMS pressure sensor of the present invention, the upper fixed electrode, the common sensitive part and the lower fixed electrode form a differential capacitor structure. Therefore, inhibition of chips on common-mode signals is enhanced, and a signal to noise ratio of output signals is improved. Meanwhile, a thickness of the common supporting part of the present invention is larger than that of the common sensitive part, such that the whole section of the sensitive structural layer is dumbbell-shaped. As a result, the peripheral common supporting part can shield strains caused by temperatures and stresses. Therefore, the strains transmitted to the common sensitive part because of temperature and stress changes are greatly reduced, and temperature stability and stress stability of the chips are improved.

The inventors of the present invention have found that in prior art, error of detection carried out by single capacitor is very large. Besides, except for the external pressure changes, other interference signals will also cause the capacitance change, for example, stress, temperature and other common-mode signals all will affect a change value of the capacitance. These harmful signals will not be attenuated or filtered but will be output together with pressure signals, and the precision and stability of pressure detection are further influenced. Thus, the technical task to be realized by the present invention or the technical problem to be solved is not contemplated or predicted by those skilled in the art, so the present invention is a new technical solution.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
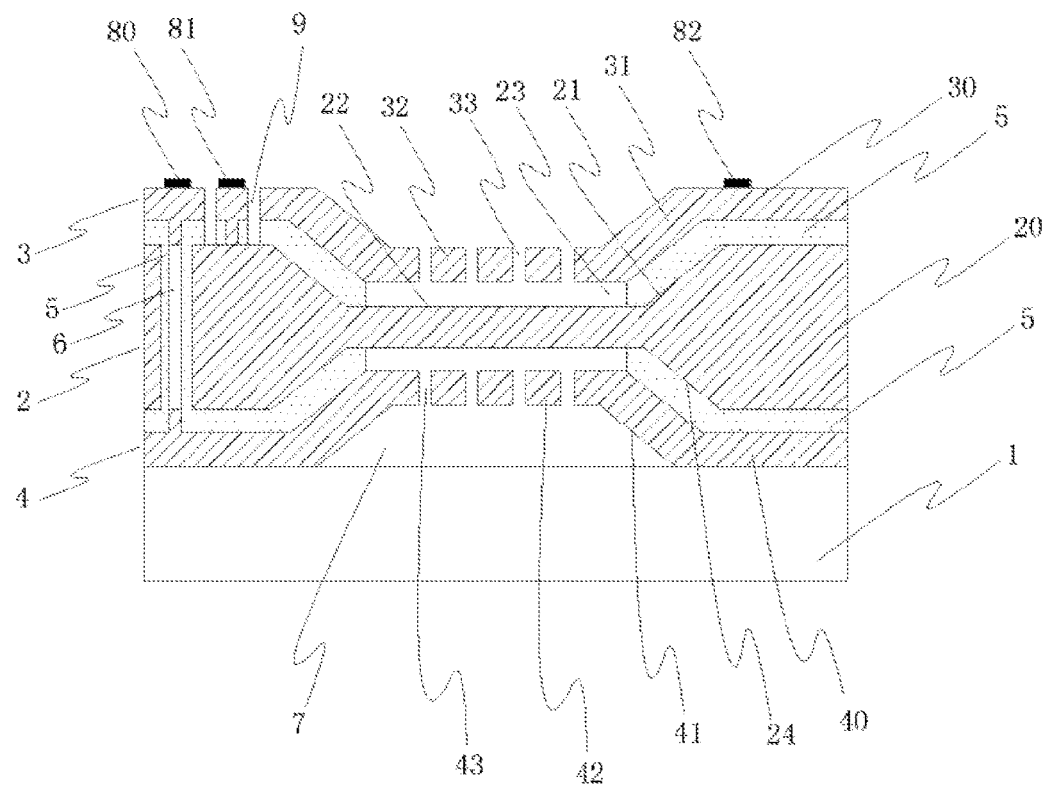
FIG. 1 is a schematic diagram of an MEMS pressure sensor of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Referring to FIG. 1, a differential capacitive MEMS pressure sensor provided by the present invention comprises a substrate 1 and a sensitive structural layer 2, an upper fixed electrode structural layer 3 and a lower fixed electrode structural layer 4 which are supported on the substrate 1, wherein the upper fixed electrode structural layer 3 is located above the sensitive structural layer 2 and forms a first detection capacitor with the sensitive structural layer 2, the lower fixed electrode structural layer 4 is located below the sensitive structural layer 2 and forms a second detection capacitor with the sensitive structural layer 2, and the sensitive structural layer 2 serves as a common sensitive electrode plate of the two detection capacitors. Besides, the upper fixed electrode structural layer 3 and the lower fixed electrode structural layer 4 are symmetric relative to the sensitive structural layer 2, such that the first detection capacitor and the second detection capacitor form a differential capacitor structure, Therefore, a detection capacity of tiny capacitance is improved, inhibition of chips on common-mode signals is enhanced, and a signal to noise ratio of output signals is improved.

Specifically, referring to FIG. 1, the sensitive structural layer 2 of the present invention comprises a common sensitive part 22 located in the middle and a common supporting part 20 located on the edge of the common sensitive part 22, and the common sensitive part 22 and the common supporting part 20 can be integral and made of a monocrystalline silicon material respectively. The common sensitive part 22 is a movable electrode plate of a capacitor structure, and under the action of external pressures, the common sensitive part 22 is bent. The common supporting part 20 mainly provides supporting for the common sensitive part 22, such that the common sensitive part 22 is maintained in a predetermined position. The edge of the common sensitive part 22 is connected on a side wall of the common supporting part 20, and preferably, a connection position is located in the middle of the side wall of the common supporting part 20, such that the common sensitive part 22 is surrounded by the common supporting part 20. A thickness of the common supporting part 20 is larger than that of the common sensitive part 22, such that a whole section of the sensitive structural layer 2 is dumbbell-shaped.

The upper fixed electrode structural layer 3 of the present invention comprises an upper fixed electrode 32 suspended above the common sensitive part 22, and the upper fixed electrode 32 can be supported and suspended above the common sensitive part 22 in a manner well-known by those skilled in the art, such that the common sensitive part 22 and the upper fixed electrode 32 form a first detection capacitor for detecting pressure changes.

In one specific embodiment of the present invention, the upper fixed electrode structural layer 3 further comprises an upper fixed electrode supporting part 30 located on the edge of the upper fixed electrode 32, and the upper fixed electrode 32 and the upper fixed electrode supporting part 30 may be integrated together and may be made of a polycrystalline silicon material. The upper fixed electrode supporting part 30 mainly provides supporting for the upper fixed electrode 32, such that the upper fixed electrode 32 is maintained in a predetermined position. The edge of the upper fixed electrode 32 and the upper fixed electrode supporting part 30 are connected, such that the upper fixed electrode 32 is surrounded by the upper fixed electrode supporting part 30. The upper fixed electrode supporting part 30 is supported on an upper end surface of the common supporting part 20 of the sensitive structural layer 2 by an insulating layer 5, such that the upper fixed electrode 32 can be suspended above the common sensitive part 22, and a space 23 allowing the first detection capacitor to work is reserved between the two.

The lower fixed electrode structural layer 4 of the present invention is located below the sensitive structural layer 2 and is consistent with the upper fixed electrode structural layer 3 in structure, and the two are vertically symmetric along the sensitive structural layer 2. The lower fixed electrode structural layer 4 comprises a lower fixed electrode 42 suspended below the common sensitive part 22, and the lower fixed electrode 42 is supported and suspended below the common sensitive part 22 in a manner well-known by those skilled in the art, such that the common sensitive part 22 and the lower fixed electrode 42 harm a second detection capacitor for detecting the pressure changes.

In one specific embodiment of the present invention, the lower fixed electrode structural layer 4 further comprises a lower fixed electrode supporting part 40 located on the edge of the lower fixed electrode 42, and the lower fixed electrode 42 and the lower fixed electrode supporting part 40 may be integrated together and may be made of a polycrystalline silicon material. The lower fixed electrode supporting part 40 mainly provides supporting for the lower fixed electrode 42, such that the lower fixed electrode 42 is maintained in a predetermined position. The edge of the lower fixed electrode 42 and the lower fixed electrode supporting part 40 are connected, such that the lower fixed electrode 42 is surrounded by the lower fixed electrode supporting part 40. The lower fixed electrode supporting part 40 is connected on a lower end surface of the common supporting part 20 of the sensitive structural layer 2 by an insulating layer 5, such that the lower fixed electrode 42 can be suspended below the common sensitive part 22, and a space allowing the second detection capacitor to work is reserved between the two.

In one specific embodiment of the present invention, the lower fixed electrode supporting part 40 can be bonded on the substrate 1 by an insulating layer, and a vacuum cavity 7 is formed between the substrate 1 and the lower fixed electrode 42. At this point, in order that the common sensitive part 22 is capable of being bent after sensing the external pressure changes a plurality of corrosion holes 33 is disposed in the upper fixed electrode 32, and through the plurality of corrosion holes 33, the common sensitive part 22 can be communicated with the outside. In one preferable embodiment of the present invention, the lower fixed electrode 42 is also provided with a plurality of corrosion holes 43. At this point, it can be regarded that the vacuum cavity 7 is defined by the common sensitive part 22 and the substrate 1. Thus, a volume of the vacuum cavity 7 is increased, and a deformation intensity of the common sensitive part 22 can better reflect a intensity of the external pressure change.

Figure 14:
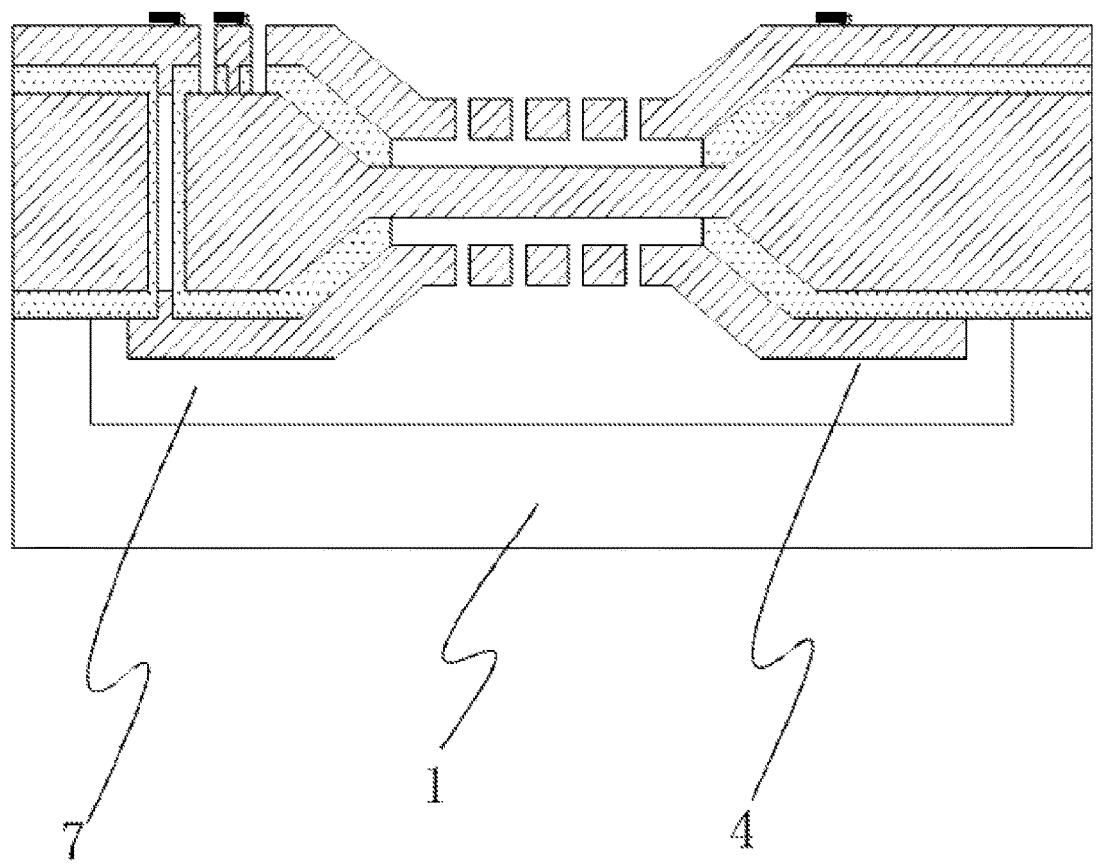
FIG. 14 is a schematic diagram of another implementing structure of the MEMS pressure sensor of the present invention.

In another specific embodiment of the present invention, referring to FIG. 14, the substrate 1 is bonded on the common supporting part 20 of the sensitive structural layer 2 by an insulating layer, and as a result, the whole lower fixed electrode structural layer 4 is suspended in the vacuum cavity 7. The lower fixed electrode structural layer 4 is separated from a bonding region of the substrate 1, and the lower fixed electrode structural layer 4 can be prevented from being damaged by a bonding process. In addition, parts of the upper and lower fixed electrodes making no contribution to sensitivity can be etched, such that parasitic capacitance of the upper and lower fixed electrodes on the common sensitive part 22 are reduced, thereby inhibiting noise. Such a method for reducing the parasitic capacitance belongs to common knowledge of those skilled in the art, and is not specifically explained here.

According to the MEMS pressure sensor of the present invention, the upper fixed electrode, the common sensitive part and the lower fixed electrode form a differential capacitor structure. Therefore, inhibition of chips on common-mode signals is enhanced, and a signal to noise ratio of output signals is improved. Meanwhile, a thickness of the common supporting part of the present invention is larger than that of the common sensitive part, such that the whole section of the sensitive structural layer is dumbbell-shaped. As a result, the peripheral common supporting part can shield strains caused by temperatures and stresses. Therefore, the strains transmitted to the common sensitive part because of temperature and stress changes are greatly reduced, and temperature stability and stress stability of the chips are improved.

In one preferable embodiment of the present invention, a connection position between the common supporting part 20 and the common sensitive part 22 has a transitional common slope, the common slope comprises a first slope 21 located on an upper surface of the common supporting part 20 and a second slope 24 located on a lower surface of the common supporting part 20, the common sensitive part 22 is connected to the common slope on the common supporting part 20, such that the common slope of the common sensitive part 22 and the common supporting part 20 form a groove approximate to an isosceles trapezoid. Meanwhile, by disposing the common slope, when the upper fixed electrode structural layer 3 and the lower fixed electrode structural layer 4 are manufactured, the upper fixed electrode structural layer 3 and the lower fixed electrode structural layer 4 are deposited on the sensitive structural layer 2 having a step gradient, so that an internal stress of a film can be greatly reduced.

In order to correspond to the sensitive structural layer 2, the upper fixed electrode structural layer 3 further comprises an inclined upper fixed electrode connecting part 31, wherein the upper fixed electrode 32 is connected to the upper fixed electrode supporting part 30 by the upper fixed electrode connecting part 31, and the upper fixed electrode connecting part 31 has a slant of the same angle as the first slope 21, such that the upper fixed electrode connecting part 31 is totally parallel with the first slope 21. The whole upper fixed electrode structural layer 3 having a uniform thickness is selected, that is to say, a structural layout of the whole upper fixed electrode structural layer 3 is totally consistent with the structure of the upper surface of the sensitive structural layer 2. The upper fixed electrode supporting part 30 is supported in a parallel manner above the common supporting part 20 by the insulating layer 5, and the upper fixed electrode connecting part 31 and the upper fixed electrode 32 are respectively supported and suspended in a parallel manner above the first slope 21 and the common sensitive part 22 by the upper fixed electrode supporting part 30. Further preferably, an insulating layer can be disposed between the upper fixed electrode connecting part 31 and the first slope 21, and the insulating layer in this position and the insulating layer 5 between the upper fixed electrode supporting part 30 and the common supporting part 20 are integrated.

The lower fixed electrode structural layer 4 and the upper fixed electrode structural layer 3 are vertically symmetric relative to the sensitive structural layer 2. In order to correspond to the sensitive structural layer 2, the lower fixed electrode structural layer 4 further comprises an inclined lower fixed electrode connecting part 41, the lower fixed electrode 42 is connected to the lower fixed electrode supporting part 40 by the lower fixed electrode connecting part 41, and the lower fixed electrode connecting part 41 has an inclination of the same angle as the second slope 24, such that the lower fixed electrode connecting part 41 is totally parallel with the first slope 21. The whole lower fixed electrode structural layer 4 having a uniform thickness is selected, that is to say, a structural layout of the whole lower fixed electrode structural layer 4 is totally consistent with the structure of the lower surface of the sensitive structural layer 2. The lower fixed electrode supporting part 40 is connected in a parallel manner below the common supporting part 20 by the insulating layer 5, and the lower fixed electrode connecting part 41 and the lower fixed electrode 42 are respectively suspended in a parallel manner below the second slope 24 and the common sensitive part 22 by the lower fixed electrode supporting part 40. Further preferably, an insulating layer can be disposed between the lower fixed electrode connecting part 41 and the second slope 24, and the insulating layer in this position and the insulating layer 5 between the lower fixed electrode supporting part 40 and the common supporting part 20 are integrated.

In the MEMS pressure sensor of the present invention, electrical signals of the upper fixed electrode 32, the common sensitive part 22 and the lower fixed electrode 42 need to be led out, and values of the first detection capacitor and the second detection capacitor are obtained by a circuit. Here, the signals of the three electrode plates mentioned above can be led out in a manner well-known by those skilled in the art. In one specific embodiment of the present invention, referring to FIG. 1, the lower fixed electrode supporting part 40 is provided with a conductive part, the lower end of the conductive part is connected to the lower fixed electrode supporting part 40, and the upper end thereof penetrates through the insulating layer 5 and the common supporting part 20 to be connected with the upper fixed electrode supporting part 30, and forms a first conductive contact 80 of the lower fixed electrode 42 on the upper fixed electrode supporting part 30.

The common supporting part 20 may also be provided with a conductive part. The conductive part penetrates through the insulating layer 5 to be connected with the upper fixed electrode supporting part 30, and forms a second conductive contact 81 of the common sensitive part 22 in a corresponding position of the upper fixed electrode supporting part 30. The upper fixed electrode supporting part 30 is further provided with a third conductive contact 82 of the upper fixed electrode 32. The three conductive contacts are all disposed on the upper fixed electrode supporting part 30. In order to insulate the conductive contacts from one another, patterned processing may be carried out on the upper fixed electrode supporting part 30 to form isolating regions 9. In this way, regions of the three conductive contacts on the upper fixed electrode supporting part 30 can be isolated from one another.

The conductive parts mentioned above play a role of electrical conduction, and can be made of any conductive material, which may be a metal material or a polycrystalline silicon material well-known by those skilled in the art. When applied to the technical solution of the present invention, the conductive part between the common supporting part 20 and the upper fixed electrode supporting part 30 may also adopt the polycrystalline silicon material, which is the same material as that of the upper fixed electrode supporting part 30. It can be understood that the conductive part and the upper fixed electrode supporting part 30 are integrated. The conductive part between the lower fixed electrode supporting part 40 and the upper fixed electrode supporting part 30 comprises a metal part 6 located in the common supporting part 20, wherein upper and lower ends of the metal part 6 are respectively connected with the upper fixed electrode supporting part 30 and the lower fixed electrode supporting part 40 by electrical connecting parts. The electrical connecting parts may be made of the polycrystalline silicon material, which is the same material as that of the upper fixed electrode supporting part 30 and the lower fixed electrode supporting part 40. Here, it can be understood that the two conductive parts are integrated with the upper fixed electrode supporting part 30 and the lower fixed electrode supporting part 40 respectively.

Figure 2:
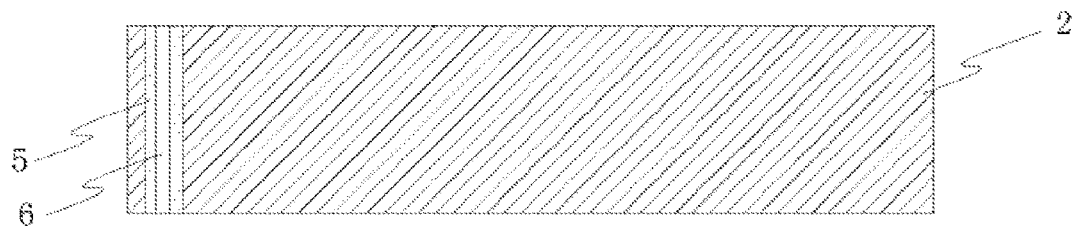
FIGS. 2-13 are process flowcharts of a manufacturing method of the MEMS pressure sensor of the present invention.
Figure 3:
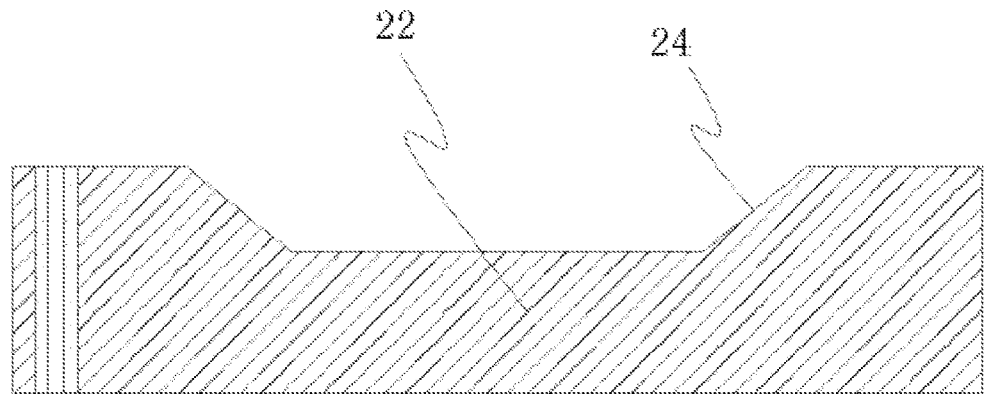
Figure 4:
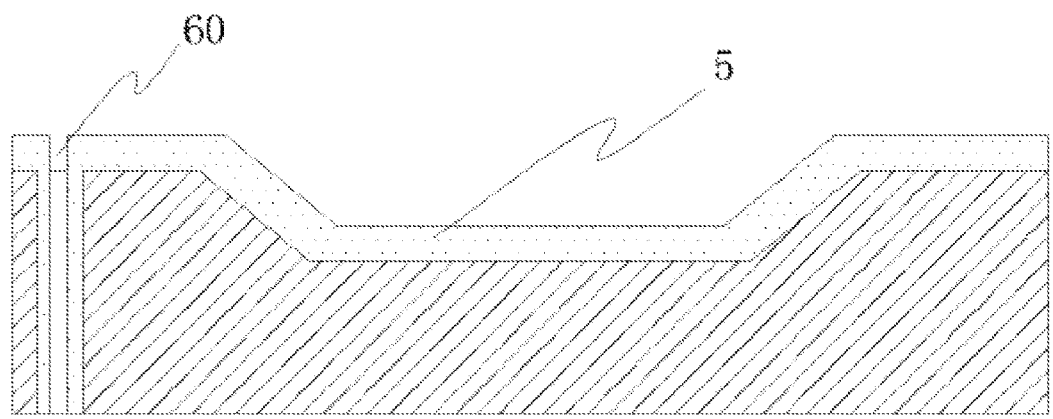
Figure 5:
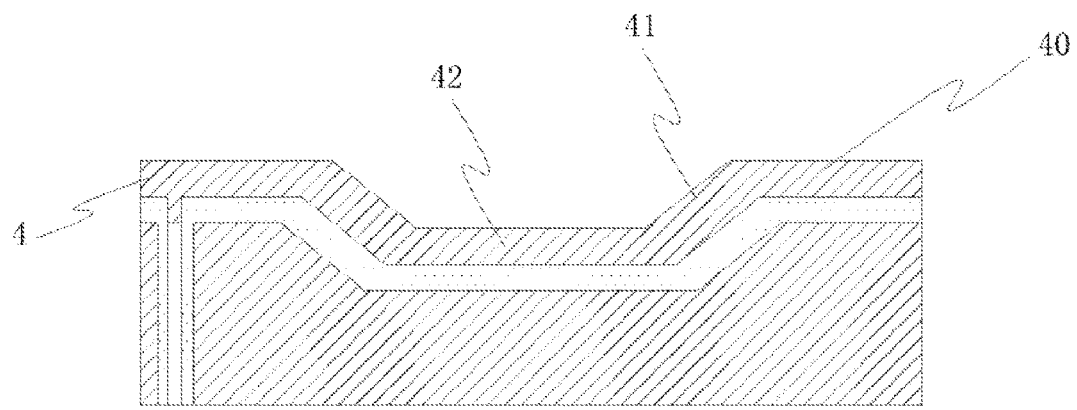
Figure 6:
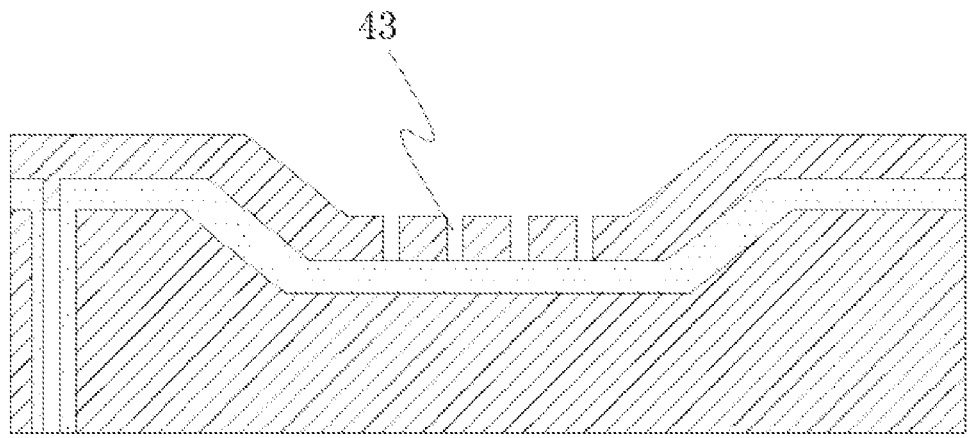
Figure 7:
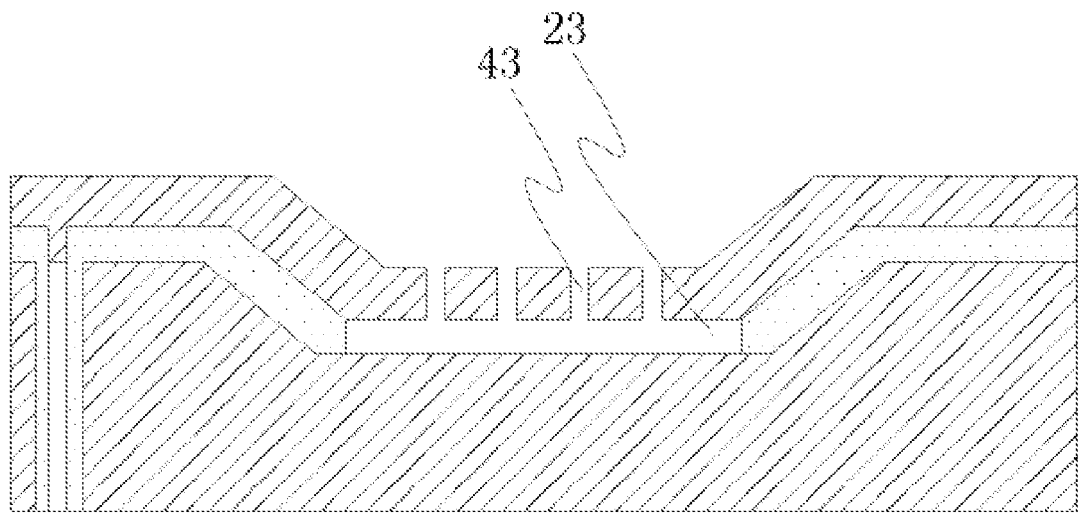
Figure 8:
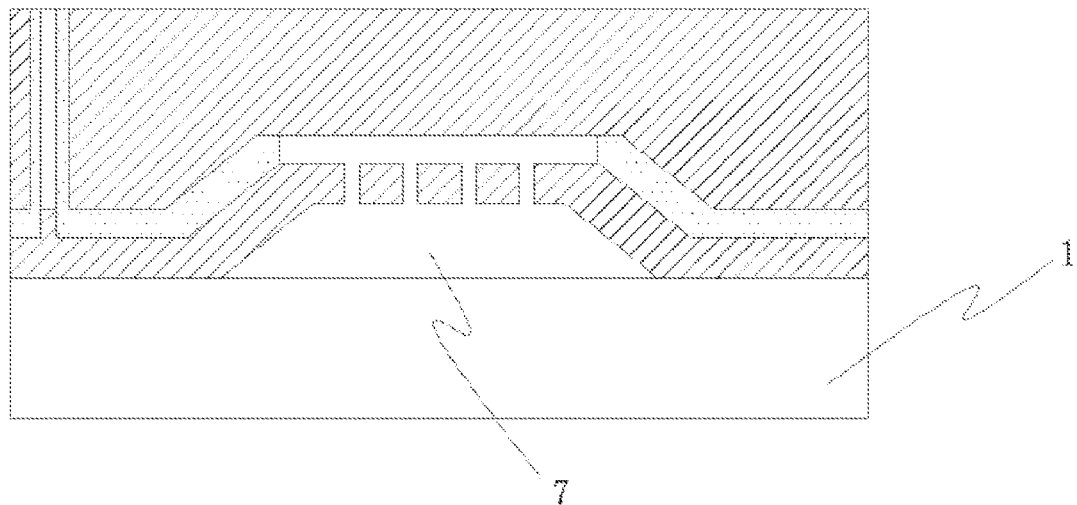
Figure 9:
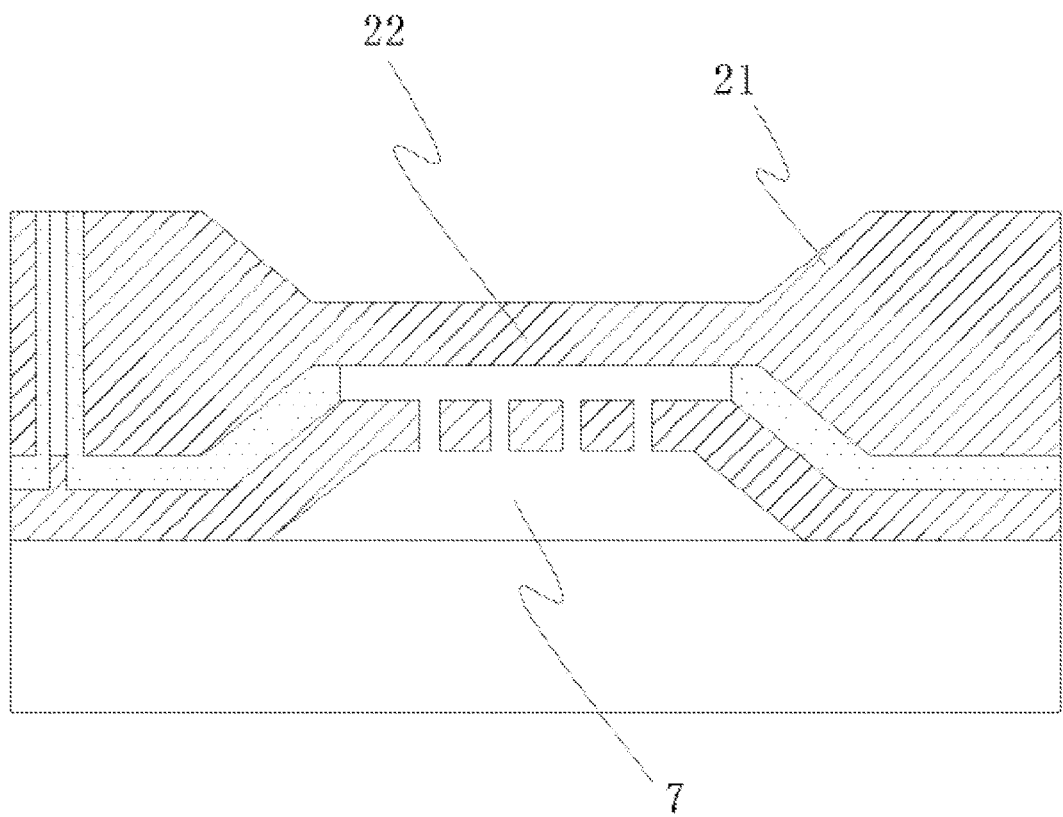
Figure 10:
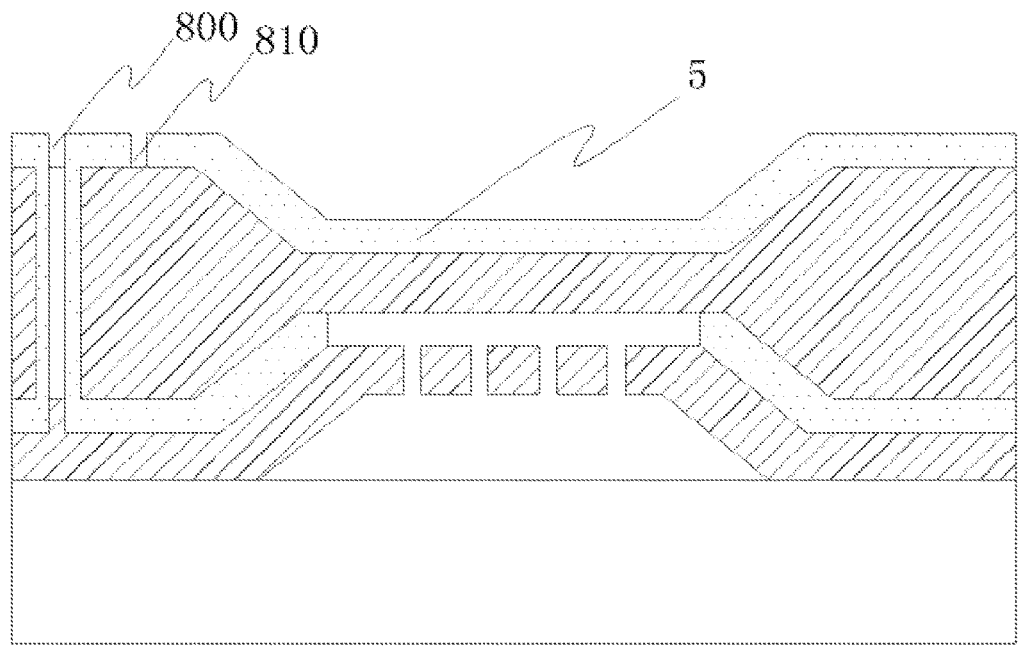
Figure 11:
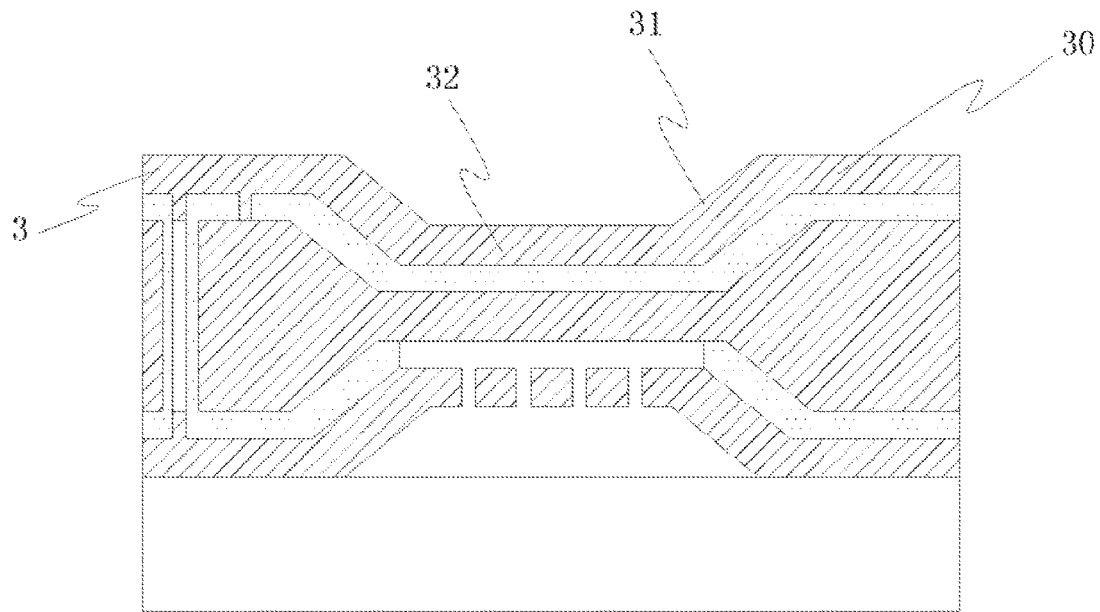
Figure 12:
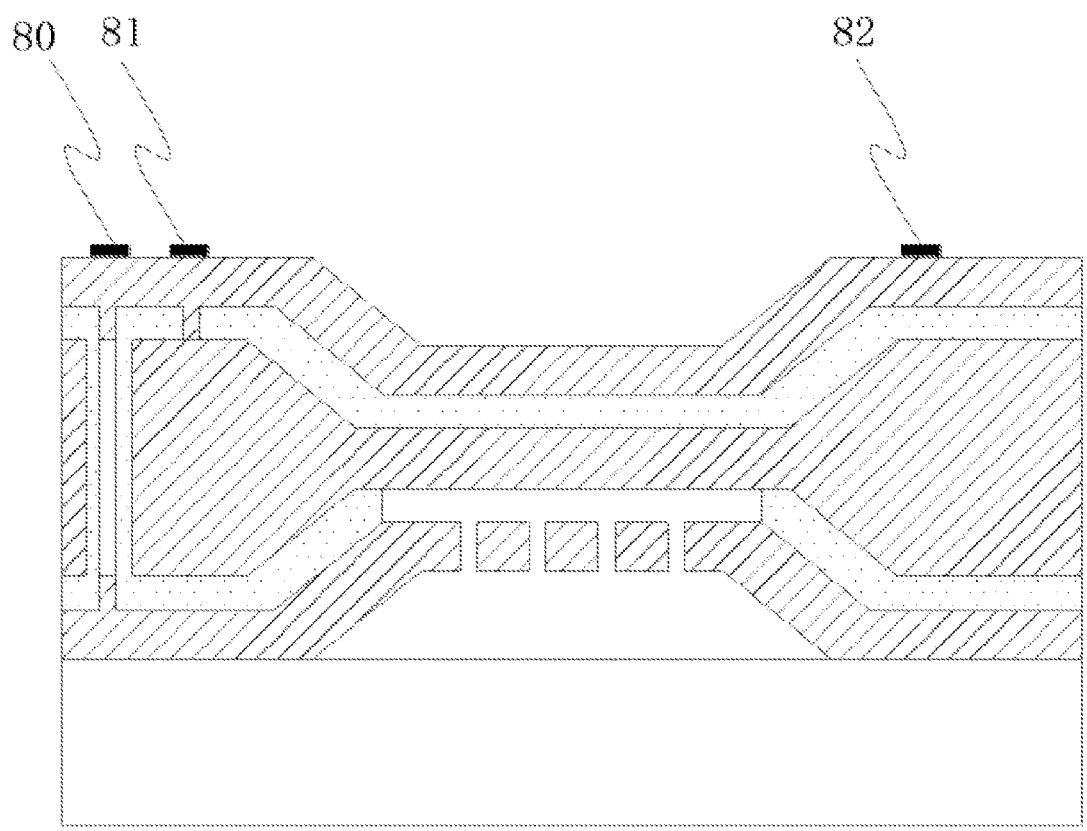
Figure 13:
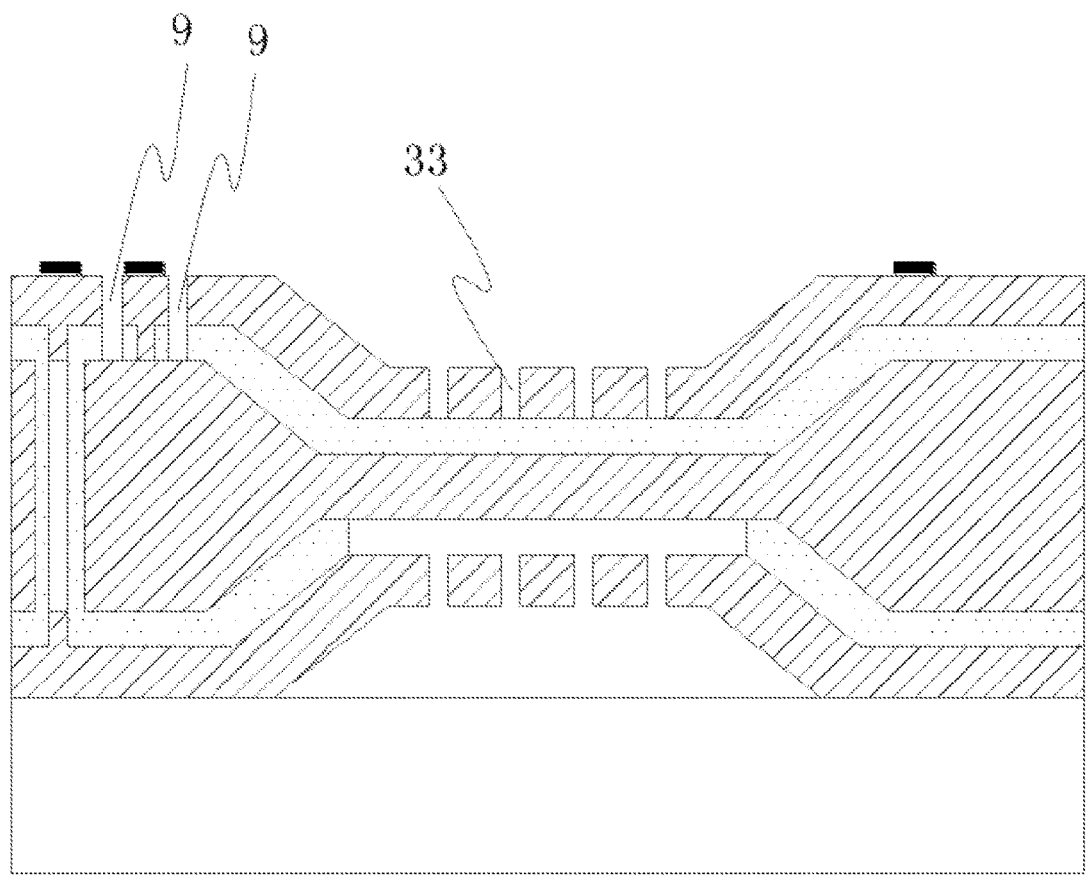

The present invention further provides a manufacturing method of the MEMS pressure sensor mentioned above, which comprises the following steps.

a) A through-hole running through upper and lower ends of the sensitive structural layer is etched in one end of the sensitive structural layer 2, and then the insulating layer 5 is grown on a wall of the through hole and a polycrystalline silicon conductive material or metal part 6 is filled into the through hole, referring to FIG. 2. The sensitive structural layer 2 may adopt a monocrystalline silicon material, and is kept insulated from the polycrystalline silicon conductive material or metal part 6 in the through hole by the insulating layer 5.

b) The upper surface of the sensitive structural layer 2 is etched or corroded to form the lower surface of the common supporting part 20, the second slope 24 and the lower surface of the common sensitive part 22, referring to FIG. 3. By an anisotropic corroding method, a groove presenting an isosceles trapezoid is formed in the upper surface of the sensitive structural layer 2, the bottom of the groove is the lower surface of the common sensitive part 22, and the side wall thereof is the second slope 24 of the common supporting part 20.

c) The insulating layer 5 is grown on the upper surface of the whole sensitive structural layer 2, such that the insulating layer 5 covers the whole upper surface of the sensitive structural layer 2. Patterned etching is carried out on the insulating layer 5 to etch the insulating layer 5 above the polycrystalline silicon conductive material or metal part 6 so as to form an etching hole 60. Therefore, an end surface of the polycrystalline silicon conductive material or metal part 6 is exposed, referring to FIG. 4.

d) The lower fixed electrode structural layer 4 is deposited on the upper surface of the insulating layer 5, the lower fixed electrode structural layer 4 may be made of the polycrystalline silicon material which has a uniform thickness. After the lower fixed electrode structural layer 4 is deposited on the insulating layer 5, the lower fixed electrode supporting part 40, the lower fixed electrode connecting part 41 and the lower fixed electrode 42 are formed. The lower fixed electrode supporting part 40 is deposited into the etching hole 60 to be connected with the polycrystalline silicon conductive material or metal part 6, referring to FIG. 5.

e) The lower fixed electrode 42 is etched to form a plurality of corrosion holes 43, referring to FIG. 6.

f) The insulating layer 5 between the lower fixed electrode 42 and the common sensitive part 22 is corroded by the corrosion holes 43, so as to release the lower fixed electrode 42 from the common sensitive part 22. A certain space 23 exists between the lower fixed electrode 42 and the common sensitive part 22, such that the lower fixed electrode 42 and the common sensitive part 22 can form a capacitor for detection, referring to FIG. 7.

g) The whole sensitive structural layer 2 and the lower fixed electrode structural layer 4 are turned over and bonded on the substrate 1, thereby forming the vacuum cavity 7 between the substrate 1 and the common sensitive part 22, referring to FIG. 8. In this step, the lower fixed electrode supporting part 40 may be bonded on the substrate 1 by the insulating layer, or by changing a structure, the common supporting part 20 may be bonded on the substrate 1 by the insulating layer.

h) After the structure above is turned over, the other surface of the sensitive structural layer 2 is processed, referring to FIG. 9. Similar to the step b), the upper surface of the sensitive structural layer 2 is etched or corroded to form the upper surface of the common supporting part 20, the first slope 21 and the upper surface of the common sensitive part 22. By the anisotropic corroding method, a groove presenting an isosceles trapezoid is formed in the upper surface of the sensitive structural layer 2, the bottom of the groove is the upper surface of the common sensitive part 22, and the side wall thereof is the first slope 21 of the common supporting part 20. The method may further comprises a step of thinning the sensitive structural layer 2 to a predetermined thickness before this step, depending on the needs.

i) The insulating layer 5 is grown on the upper surface of the whole sensitive structural layer 2, such that the insulating layer 5 covers the whole upper surface of the sensitive structural layer 2. Patterned etching is carried out on the insulating layer 5 to etch the insulating layer 5 above the polycrystalline silicon conductive material or metal part 6 to form an etching hole 800, and an end surface of the polycrystalline silicon conductive material or metal part 6 is exposed. Meanwhile, the insulating layer 5 in the predetermined position above the common supporting part 20 is etched to form an etching hole 810 so as to expose part of the common supporting part 20, referring to FIG. 10.

j) The upper fixed electrode structural layer 3 is deposited on the upper surface of the insulating layer 5. Similar to the step d), the upper fixed electrode structural layer 3 may be made of the polycrystalline silicon material which has a uniform thickness. After the upper fixed electrode structural layer 3 is deposited on the insulating layer 5, the upper fixed electrode supporting part 30, the upper fixed electrode connecting part 31 and the upper fixed electrode 32 are formed. The upper fixed electrode supporting part 30 is deposited into the etching holes 800 and 810 to be respectively connected with the polycrystalline silicon conductive material or metal part 6 and the common supporting part 20, referring to FIG. 11.

k) The first conductive contact 80, the second conductive contact 81 and the third conductive contact 82 are manufactured in corresponding positions of the upper fixed electrode supporting part 30, referring to FIG. 12. Specifically, the first conductive contact 80 is located right above the etching hole 800 and the second conductive contact 81 is located right above the etching hole 810.

l) The upper fixed electrode 32 is etched to form the corrosion holes 33. The upper fixed electrode supporting part 30 is etched to form the isolating regions 9 so as to isolate the first conductive contact 80, the second conductive contact 81 and the third conductive contact 82 from one another, referring to FIG. 13.

m) The insulating layer 5 between the upper fixed electrode 32 and the common sensitive part 22 is etched by the corrosion holes 33 so as to release the upper fixed electrode 32 from the common sensitive part 22. There is a certain space 23 between the upper fixed electrode 32 and the common sensitive part 22, such that the upper fixed electrode 32 and the common sensitive part 22 can form a capacitor for detection, referring to FIG. 1.

According to the manufacturing method of the present invention, formation of the sensitive structural layer is finished by corroding or etching the upper and lower surfaces, and a processing cost of chips is reduced. Meanwhile, the monocrystalline silicon is adopted to manufacture the sensitive structural layer, so that a residual stress is greatly reduced, and stability of the chips is improved. As the polycrystalline silicon layers of the upper fixed electrode structural layer and the lower fixed electrode structural layer are deposited on the surface of the sensitive structural layer having a step gradient, an internal stress of the film can be greatly reduced.

Although some specific embodiments of the present invention have been demonstrated in detail with examples, it should be understood by a person skilled in the art that the above examples are only intended to be illustrative but not to limit the scope of the present invention.

What is claimed is:

1. A differential capacitive MEMS pressure sensor, comprising:
    a sensitive structural layer, comprising a common sensitive part located in the middle and a common supporting part located on the edge of the common sensitive part, wherein the common sensitive part is connected on a side wall of the common supporting part, and a thickness of the common supporting part is larger than that of the common sensitive part, such that a whole section of the sensitive structural layer is dumbbell-shaped;
    an upper fixed electrode structural layer, comprising an upper fixed electrode which is suspended above the common sensitive part and forms a capacitor structure with the common sensitive part, the upper fixed electrode being provided with corrosion holes;
    a lower fixed electrode structural layer, consistent with the upper fixed electrode structural layer in structure, wherein the two are vertically symmetric along the sensitive structural layer, wherein the lower fixed electrode structural layer comprises a lower fixed electrode, which is suspended below the common sensitive part and forms a capacitor structure with the common sensitive part, and the lower fixed electrode is provided with corrosion holes; and
    a substrate for supporting, a vacuum cavity being formed between the substrate and the common sensitive part, wherein a connection position between the common supporting part and the common sensitive part has a transitional common slope, and the common slope comprises a first slope located on an upper surface of the common supporting part, and a second slope located on a lower surface of the common supporting part.

2. The MEMS pressure sensor according to claim 1, wherein
    the upper fixed electrode structural layer comprises an upper fixed electrode supporting part connecting the edge of the upper fixed electrode, the upper fixed electrode supporting part is connected to the upper surface of the common supporting part by an insulating layer; and
    the lower fixed electrode structural layer comprises a lower fixed electrode supporting part connecting to the edge of the lower fixed electrode, the lower fixed electrode supporting part is connected to the upper surface of the common supporting part by an insulating layer.

3. The MEMS pressure sensor according to claim 2, wherein
    the upper fixed electrode structural layer further comprises an inclined upper fixed electrode connecting part, wherein the upper fixed electrode is connected to the upper fixed electrode supporting part by the upper fixed electrode connecting part, and the upper fixed electrode connecting part is located above the first slope and has the same slant as the first slope; and
    the lower fixed electrode structural layer further comprises an inclined lower fixed electrode connecting part, wherein the lower fixed electrode is connected to the lower fixed electrode supporting part by the lower fixed electrode connecting part, and the lower fixed electrode connecting part is located below the second slope and has the same slant as the second slope.

4. The MEMS pressure sensor according to claim 3, wherein the insulating layer is respectively disposed between the upper fixed electrode connecting part and the first slope and between the lower fixed electrode connecting part and the second slope.

5. The MEMS pressure sensor according to claim 2, wherein
    the lower fixed electrode supporting part is provided with a conductive part, the conductive part penetrates through the insulating layer and the common supporting part to be connected with the upper fixed electrode supporting part, and is isolated on the upper fixed electrode supporting part to form a first conductive contact of the lower fixed electrode;
    the common supporting part is provided with a conductive part, the conductive part penetrates through the insulating layer to be connected with the upper fixed electrode supporting part, and is isolated on the upper fixed electrode supporting part to form a second conductive contact of the common sensitive part; and
    the upper fixed electrode supporting part is further provided with a third conductive contact of the upper fixed electrode.

6. The MEMS pressure sensor according to claim 2, wherein the substrate is connected on the lower fixed electrode supporting part of the lower fixed electrode structural layer by the insulating layer.

7. The MEMS pressure sensor according to claim 2, wherein the substrate is connected on the common supporting part of the sensitive structural layer by the insulating layer, and the lower fixed electrode structural layer is suspended in the vacuum cavity.

8. A manufacturing method of the MEMS pressure sensor according to claim 1, comprising the following steps:
- a) etching a through-hole running through upper and lower ends of the sensitive structural layer in one end of the sensitive structural layer, then growing an insulating layer on a wall of the through-hole and filling a polycrystalline silicon conductive material or metal part into the through hole;
- b) etching or corroding the upper surface of the sensitive structural layer to form the lower surface of the common supporting part, the second slope and the lower surface of the common sensitive part;
- c) growing the insulating layer on the upper surface of the whole sensitive structural layer and carrying out patterned etching on the insulating layer;
- d) depositing the lower fixed electrode structural layer on the upper surface of the insulating layer to form the lower fixed electrode supporting part, the lower fixed electrode connecting part and the lower fixed electrode, the lower fixed electrode supporting part and the polycrystalline silicon conductive material or metal part being connected together;
- e) etching the lower fixed electrode to form the corrosion holes;
- f) corroding the insulating layer between the lower fixed electrode and the common sensitive part by the corrosion holes and releasing the lower fixed electrode from the common sensitive part;
- g) turning over the whole sensitive structural layer and the lower fixed electrode structural layer, and bonding the two on the substrate, thereby forming the vacuum cavity between the substrate and the common sensitive part;
- h) etching or corroding the upper surface of the sensitive structural layer to form the upper surface of the common supporting part, the first slope and the upper surface of the common sensitive part;
- i) growing the insulating layer on the upper surface of the whole sensitive structural layer and carrying out patterned etching on the insulating layer;
- j) depositing the upper fixed electrode structural layer on the upper surface of the insulating layer to form the upper fixed electrode supporting part, the upper fixed electrode connecting part and the upper fixed electrode, wherein the upper fixed electrode supporting part, the polycrystalline silicon conductive material or the metal part and the common supporting part are connected by the patterned insulating layer;
- k) manufacturing the first conductive contact, the second conductive contact and the third conductive contact in corresponding positions of the upper fixed electrode supporting part;
- l) etching the upper fixed electrode to form the corrosion holes; and etching the upper fixed electrode supporting part to isolate the first conductive contact, the second conductive contact and the third conductive contact from one another; and
- m) etching the insulating layer between the upper fixed electrode and the common sensitive part by the corrosion holes and releasing the upper fixed electrode from the common sensitive part.

9. The manufacturing method according to claim 8, further comprising a step of thinning the sensitive structural layer to a predetermined thickness between the step g) and the step h).

* * * * *